(12) United States Patent
Nomura et al.

(10) Patent No.: US 6,741,327 B2
(45) Date of Patent: May 25, 2004

(54) METHOD OF CORRECTING PROJECTION OPTICAL SYSTEM AND METHOD OF MANUFACTURING SEMICONDUCTOR DEVICE (75) Inventors: Hiroshi Nomura, Kawasaki (JP); Kenji Konomi, Yokohama (JP); Manabu Takakuwa, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 45 days.

(21) Appl. No.: 09/893,631

(22) Filed: Jun. 29, 2001

(65) Prior Publication Data

US 2002/0001071 A1 Jan. 3, 2002

(30) Foreign Application Priority Data

Jun. 30, 2000 (JP) ........................................ 2000-200123

(51) Int. Cl.[7] .................. G03B 27/68; G03B 27/42; G03B 27/54; G03F 9/00; G03C 5/00
(52) U.S. Cl. .................. 355/52; 355/53; 355/55; 355/67; 355/77; 430/5; 430/30; 430/311; 430/312
(58) Field of Search .................. 355/52, 53, 55, 355/67, 77; 430/30, 5, 311, 312

(56) References Cited

U.S. PATENT DOCUMENTS

| 5,610,684 | A | * | 3/1997 | Shiraishi |
| 5,680,588 | A | * | 10/1997 | Gortych et al. |
| 5,978,085 | A | | 11/1999 | Smith et al. |
| 6,011,611 | A | | 1/2000 | Nomura et al. |
| 6,130,747 | A | | 10/2000 | Nomura et al. |
| 6,266,389 | B1 | * | 7/2001 | Murayama et al. |
| 6,304,317 | B1 | * | 10/2001 | Taniguchi et al. |
| 6,329,112 | B1 | * | 12/2001 | Fukuda et al. |

FOREIGN PATENT DOCUMENTS

| JP | 11-52582 | 2/1999 |
| JP | 11-237310 | 8/1999 |

OTHER PUBLICATIONS

Nomura et al., "Aberration Measurement from Specific Photolithographic Images: A Different Approach," *Applied Optics.*, 39, pp. 1136–1147 (Mar. 1, 2000).

* cited by examiner

*Primary Examiner*—Frank G. Font
*Assistant Examiner*—Khaled Brown
(74) *Attorney, Agent, or Firm*—Finnegan, Henderson, Farabow, Garrett & Dunner, L.L.P.

(57) ABSTRACT

The method of correcting a residual aberration of a projection optical system, which is used for projecting a pattern of a photo mask onto a photosensitive film located on a substrate, the method includes calculating an effect of a residual aberration on a given pattern on the basis of the residual aberration of the projection optical system obtained by measurement, calculating a moving amount of an adjustable aberration in the projection optical system such that the effect of the residual aberration becomes minimum in a given area, and moving the adjustable aberration in accordance with the calculated moving amount.

5 Claims, 6 Drawing Sheets

| Defocus and spherical aberration | Shift and comatic aberration | | Astigmatic aberration | | Three-foil | | Four-foil | | Five-foil | |
|---|---|---|---|---|---|---|---|---|---|---|
| Z4 | Z2 | Z3 | | | | | | | | |
| Z9 | Z7 | Z8 | Z5 | Z6 | | | | | | |
| Z16 | Z14 | Z15 | Z12 | Z13 | Z10 | Z11 | | | | |
| Z25 | Z23 | Z24 | Z21 | Z22 | Z19 | Z20 | Z17 | Z18 | | |
| Z36 | Z34 | Z35 | Z32 | Z33 | Z30 | Z31 | Z28 | Z29 | Z26 | Z27 |

METHOD OF CORRECTING PROJECTION OPTICAL SYSTEM AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2000-200123, filed Jun. 30, 2000, the entire contents of which are incorporated herein by reference.

BACKGROUND OF THE INVENTION

1. Field of the Invention

The present invention relates to a method of correcting a projection optical system and a method of manufacturing a semiconductor device by using such a correction method.

2. Description of the Related Art

At present, the reduction projection exposure system used in the manufacture of semiconductor devices entails the problems of deformation of device patterns and deterioration of the focus latitude due to residual aberrations in the projection lens. As a solution to these problems, for example, Jpn. Pat. Appln. KOKAI Publication No. 11-52582 proposes a technique for correcting such adverse effects to device patterns due to the residual aberrations.

The invention discussed in the above publication relates to transfer of a device pattern with use of an alternating phase shift mask, and correction measures in this invention are carried out as follows. That is, a mask pattern used for detecting a comatic aberration is projected to a resist at a predetermined reduction rate. Then, the projected resist pattern and a pattern obtained by reducing the original mask pattern at the predetermined reduction rate are compared with each other in order to measure the degree of the effects of the comatic aberration. The mask pattern is corrected on the basis of the measured result.

The technique of the invention disclosed in the above document is not at all different from a case where the condition setting operation generally used for obtaining an optimal mask pattern is applied to an alternating mask in the case where an actual device pattern is used as a mask pattern for detecting the comatic aberration. In the condition setting operation for the optimal mask pattern in an ordinary binary mask, correction for the effects of aberrations is carried out at the same time as correction with regard to an optical proximity effect (OPE) or a resist process effect. This is because these operational steps cannot be separated from each other. It is a well-known fact that an alternating phase shift mask entails lager aberration effects than that of a binary mask. From this fact, it is only natural that the ratio of the operation of correcting the effect of aberrations becomes relatively high in the condition setting operation for an optimal mask pattern in an alternating phase shift mask. For this reason, it is considered that the invention disclosed in the document emphases such a fact.

Meanwhile, the degree of the effects of aberrations, expressed by, for example, the deformation amount of a pattern, varies widely depending on the type of mask (such as binary mask, attenuated phase shift mask, and alternating phase shift mask), illumination conditions (large σ illumination, reduced σ illumination, annular illumination and quadruple illumination), design of pattern (shape, design rule and critical dimensions). Therefore, it is not always true that the larger the aberration itself, the greater the effect of the aberration, or the smaller the aberration itself, the smaller the effect of the aberration. Thus, nothing can be gained, in practical terms, as long as not the effects of the aberrations are examined, in stead of the aberration. Further, it is theoretically absolutely impossible to have a projection lens completely free of aberrations. Thus, as long as optical lithography is employed, the problem of aberrations will inevitably remain.

Under these circumstances, there can be proposed several methods as techniques for correcting the effects of aberrations in the actual manufacture of semiconductor devices.

First, as in the case of the published document presented above, there is a method for correcting a design of a mask pattern in consideration of the effects of aberrations. In this method, at first, a device mask is formed in consideration of an ideal situation, and on the basis of the result obtained by transferring the pattern of the thus obtained device mask onto a substrate, a final device mask is formed. Therefore, this method entails such a problem that the accuracy of the firstly formed mask has a significant influence on the correction accuracy of the final mask. Further, when the illumination conditions are changed in the middle of an operation, the data handled up to the time of the condition change becomes unusable, and therefore the operation must be started all over again from the beginning. Furthermore, the effects caused by aberrations may vary due to slight differences in dimensions. Therefore, in order to make a mask design to fall within an allowable range, it is considered that the correction of mask must be repeated a number of times.

Second, there is a method of varying the illumination conditions such as to lessen the effects of aberrations. However, the initial illumination conditions are set such as to maximize the exposure latitude, and therefore the latitude is reduced after changing the illumination conditions as compared to the transfer of a pattern under the initial illumination conditions. Further, it is not clear whether a practical solution is present or not, and therefore the method itself cannot be certain at all.

Further, each of the above-described methods is time consuming. Regarding the semiconductor devices manufactured at present as well as in the future, there is a general tendency for producing small batches of a variety of types, and the number of types of device patterns will be drastically increased. Therefore, it is expected that there will be a variety of types of effects on device patterns due to aberrations, and it will become necessary to realize an aberration correction method capable of quickly responding to the effects of aberrations.

As described above, with regard to the projecting exposure devices, the residual aberrations of a projection optical system are becoming an increasingly serious problem. However, with the methods of correcting the mask pattern or illumination conditions, a quick alteration in the processing is difficult to accommodate.

BRIEF SUMMARY OF THE INVENTION

According to the first aspect of the present invention, there is provided a method of correcting a residual aberration of a projection optical system, which is used for projecting a pattern of a photo mask onto a photosensitive film located on a substrate, the method comprising: calculating an effect of a residual aberration on a given pattern on the basis of the residual aberration of the projection optical system obtained by measurement, calculating a moving amount of an adjustable aberration in the projection optical system such that the effect of the residual aberration becomes minimum in a given area, and moving the adjustable aberration in accordance with the calculated moving amount.

According to the second aspect of the present invention, there is provided a method of manufacturing a semiconductor device, comprising correcting a residual aberration of a projection optical system, using the correction method described above, and projecting a pattern of a photo mask onto a photosensitive film located on a semiconductor substrate by the projection optical system.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

In order to make the present invention easily understandable, the aberration will be described first.

The aberration can be categorized into two types. One is an aberration which can be confirmed by comparing different positions within a field (that is, a global aberration), whereas another is an aberration which can be expressed in a Zernike polynomial (that is, a local aberration).

The global aberration can be further divided into a field curvature which expresses a focal error distribution within a field, and a distortion which expresses a lateral error distribution of a transfer pattern within a filed.

On the other hand, the local aberration, that is, Zernike aberration, can be further categorized on the basis of the symmetry number in the rotation direction of the lens and the highest order of the pupil radius of the lens. The Zernike aberration is categorized in accordance with the symmetry number in the rotating direction into components in order such as a spherical aberration, coma, astigmatism, three-foil, four-foil, five-foil . . . . In general, a high order aberration indicates both an aberration component having a high symmetry number in the rotating direction and an aberration component having a high order of the pupil radius.

Further, there is a general tendency that the lower the order of aberration, the easier the aberration varies with regard to a change in environmental circumstances such as atmospheric pressure and temperature, or movements of lens units which constitute the projection optical system, or in reverse, the higher the order of aberration, the less easily it varies.

The local aberration, that is, the Zernike aberration (Zernike polynomials), will now be briefly described.

Figure 1:
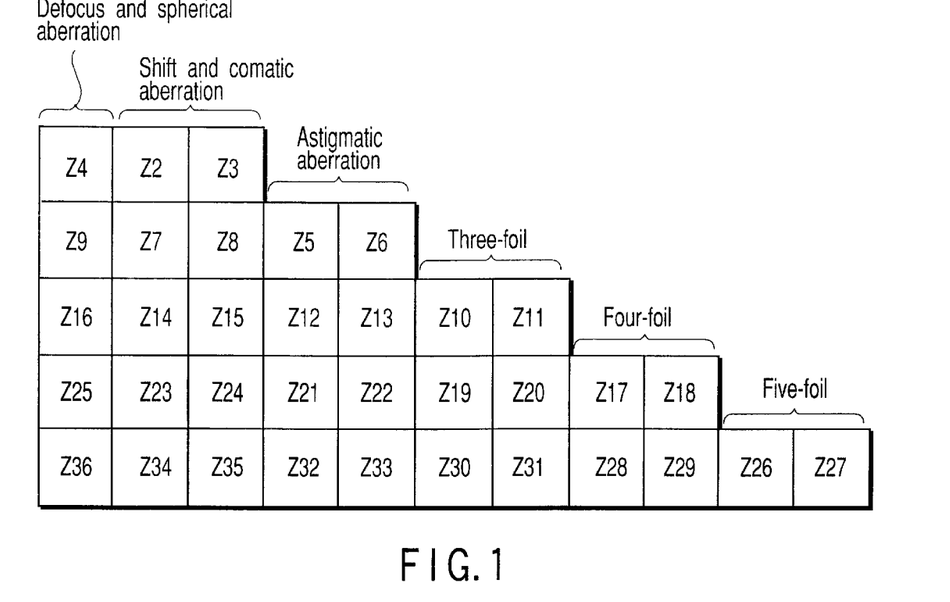
FIG. 1 is a diagram describing each term of Zernike polynomial.

FIG. 1 illustrates the terms of the Zernike polynomials. The terms are expressed as follows:

$Z_1=1$ $Z_2=2\rho \cos \theta$ $Z_3=2\rho \sin \theta$ $Z_4=3^{1/2} (2\rho^2-1)$ $Z_5=6^{1/2} \rho^2 \cos 2\theta$ $Z_6=6^{1/2} \rho^2 \sin 2\theta$ $Z_7=8^{1/2} (3\rho^2-2) \rho \cos \theta$ $Z_8=8^{1/2} (3\rho^2-2) \rho \sin \theta$ $Z_9=5^{1/2} (6\rho^4-6\rho^2+1)$ $Z_{10}=8^{1/2} \rho^3 \cos 3\theta$ $Z_{11}=8^{1/2} \rho^3 \sin 3\theta$ $Z_{12}=10^{1/2} (4\rho^2-3) \rho^2 \cos 2\theta$ $Z_{13}=10^{1/2} (4\rho^2-3) \rho^2 \sin 2\theta$ $Z_{14}=12^{1/2} (10\rho^4-12\rho^2+3) \rho \cos \theta$ $Z_{15}=12^{1/2} (10\rho^4-12\rho^2+3) \rho \sin \theta$ $Z_{16}=7^{1/2} (20\rho^6-30\rho^4+12\rho^2-1)$ $Z_{17}=10^{1/2} \rho^4 \cos 4\theta$ $Z_{18}=10^{1/2} \rho^4 \sin 4\theta$ $Z_{19}=12^{1/2} (5\rho^2-4) \rho^3 \cos 3\theta$ $Z_{20}=12^{1/2} (5\rho^2-4) \rho^3 \sin 3\theta$ $Z_{21}=14^{1/2} (15\rho^4-20\rho^2+6) \rho^2 \cos 2\theta$ $Z_{22}=14^{1/2} (15\rho^4-20\rho^2+6) \rho^2 \sin 2\theta$ $Z_{23}=4 (35\rho^6-60\rho^4+30\rho^2-4) \rho \cos \theta$ $Z_{24}=4 (35\rho^6-60\rho^4+30\rho^2-4) \rho \sin \theta$ $Z_{25}=3 (70\rho^8-140\rho^6+90\rho^4-20\rho^2-1)$ $Z_{26}=12^{1/2} \rho^5 \cos 5\theta$ $Z_{27}=12^{1/2} \rho^5 \sin 5\theta$ $Z_{28}=14^{1/2} (6\rho^2-5) \rho^4 \cos 4\theta$ $Z_{29}=14^{1/2} (6\rho^2-5) \rho^4 \sin 4\theta$ $Z_{30}=4 (21\rho^4-30\rho^2+10) \rho^3 \cos 3\theta$ $Z_{31}=4 (21\rho^4-30\rho^2+10) \rho^3 \sin 3\theta$ $Z_{32}=18^{1/2} (56\rho^6-105\rho^4+60\rho^2-10) \rho^2 \cos 2\theta$ $Z_{33}=18^{1/2} (56\rho^6-105\rho^4+60\rho^2-10) \rho^2 \sin 2\theta$ $Z_{34}=20^{1/2} (126\rho^8-280\rho^6+210\rho^4-60\rho^2+5) \rho \cos \theta$ $Z_{35}=20^{1/2} (126\rho^8-280\rho^6+210\rho^4-60\rho^2+5) \rho \sin \theta$ $Z_{36}=11^{1/2} (252\rho^{10}-630\rho^8+650\rho^6-210\rho^4+30\rho^2-1)$ Each of the rows shown in FIG. 1 is categorized into sections in accordance with the symmetry number in the rotation direction, and as these sections, a spherical aberration (including defocus), a comatic aberration (including image shift), an astigmatic aberration, Three-foil, Four-foil, Five-foil, . . . , are arranged. It should be noted that the lower the place of section, the higher the order of pupil radius of the aberrations. A general local aberration can be expressed in linear combination of the terms. Therefore, the magnitude of each aberration is expressed by the coefficient of each term. Further, in FIG. 1, the more upper left the section located, the lower the order of the aberration, that is, the more easily moved, whereas the more lower right the section located, the higher the order of the aberration, that is, the less easily moved.

An embodiment of the present invention will now be described in detail with reference to accompanying drawings.

Figure 2A:
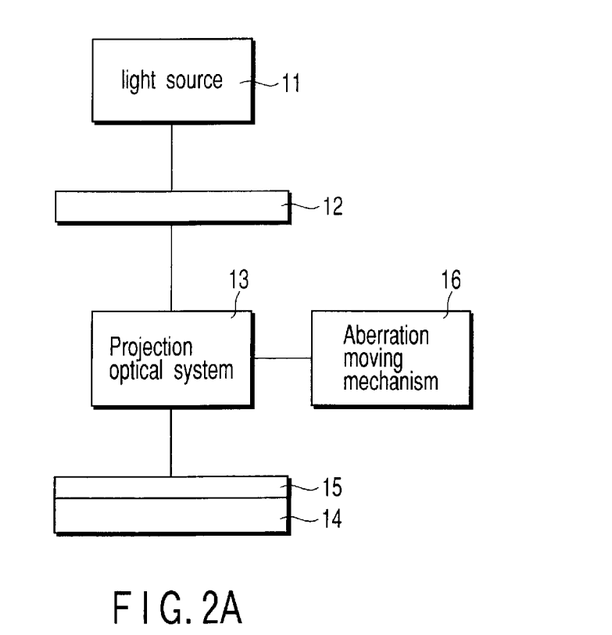
FIG. 2A is a schematic block diagram illustrating an exposure system to which the aberration correction method according to an embodiment of the present invention is applied.

FIG. 2A is a schematic block diagram illustrating an exposure system to which the method according to an embodiment of the present invention is applied. The basic structure is similar to a general exposure system. That is, light is irradiated from a light source 11 to a mask 12, and a pattern of the mask 12 is projected onto a resist film 15 on a substrate 14 (semiconductor substrate) by a projection optical system 13. Aberrations in the projection optical system 13 can be moved by an aberration moving mechanism 16.

The details of the embodiment of the present invention will now be described with reference to a flowchart shown in FIG. 2B.

Figure 3:
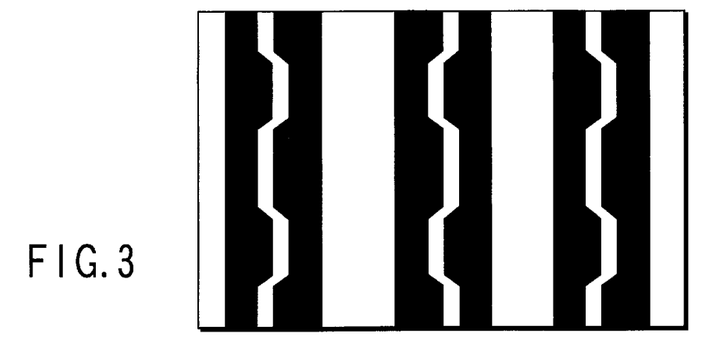
FIG. 3 is a diagram showing a mask pattern employed in the embodiment of the present invention.
Figure 4:
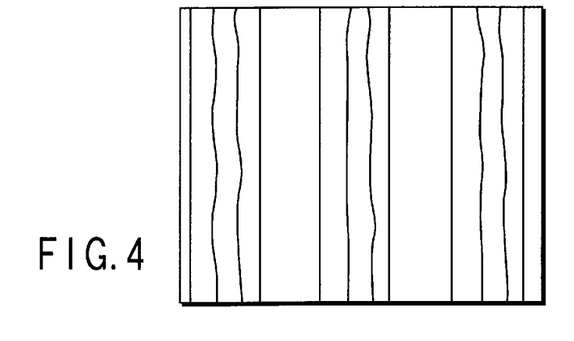
FIG. 4 is a diagram showing a transfer pattern of a case where an exposure is carried out using the mask pattern shown in FIG. 3.

In this embodiment, a twin-bar pattern as shown in FIG. 3 is employed as a specific example of the mask pattern. In this pattern, paired two-line patterns are made in such an arrangement that they appear periodically. Thus pattern entails such a problem that right and left lines having certain widths are transferred asymmetrically as can be seen in FIG. 4 due to the effect of aberrations in the projection lens. The embodiment will be described in connection with an example case where such a difference between the right and left line patterns in width (the width of a paired left line—the width of a paired right line) is to be reduced in the entire surface of the mask.

Figure 11:
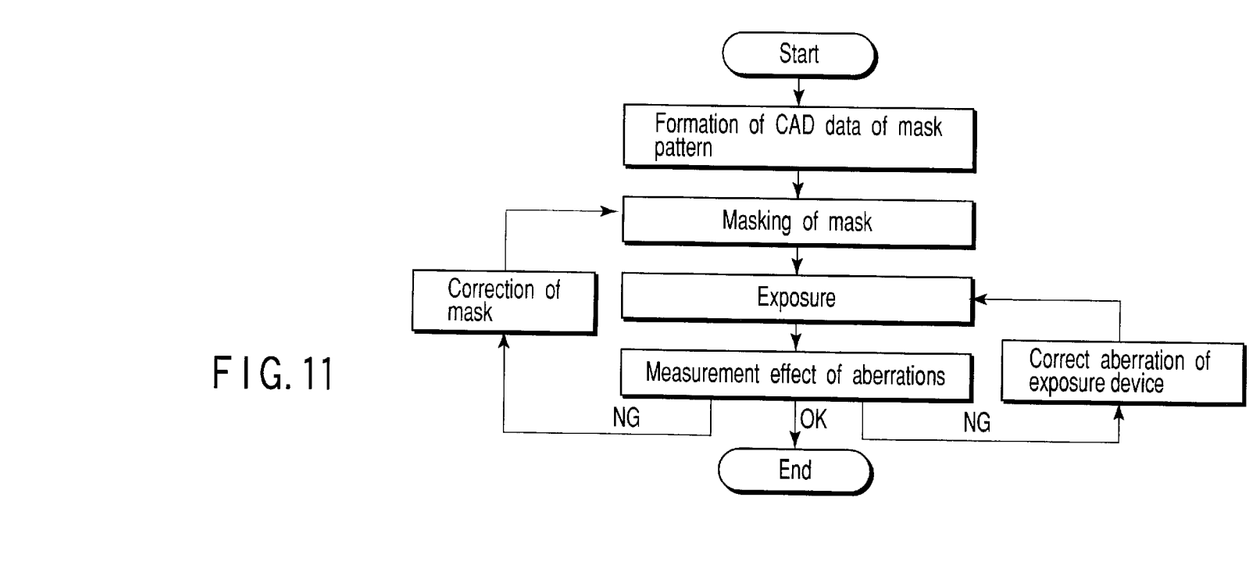
FIG. 11 is a flowchart illustrating a comparative example to the embodiment of the present invention.

FIG. 11 is a flowchart illustrating a correction method according to a comparative example. After the "formation of CAD data (designed data) of mask pattern", a series of steps such as "making of mask", "exposure" and "measurement of effect of aberrations" are carried out. After that, the "correction of mask" is carried out and then the operational step is repeated again from the "making of mask", or the "correction of aberrations in the exposure device" is carried out and then the operational step is repeated from the "exposure". In the above-described manner, these correction steps are repeated until an allowable pattern is obtained.

Figure 2B:
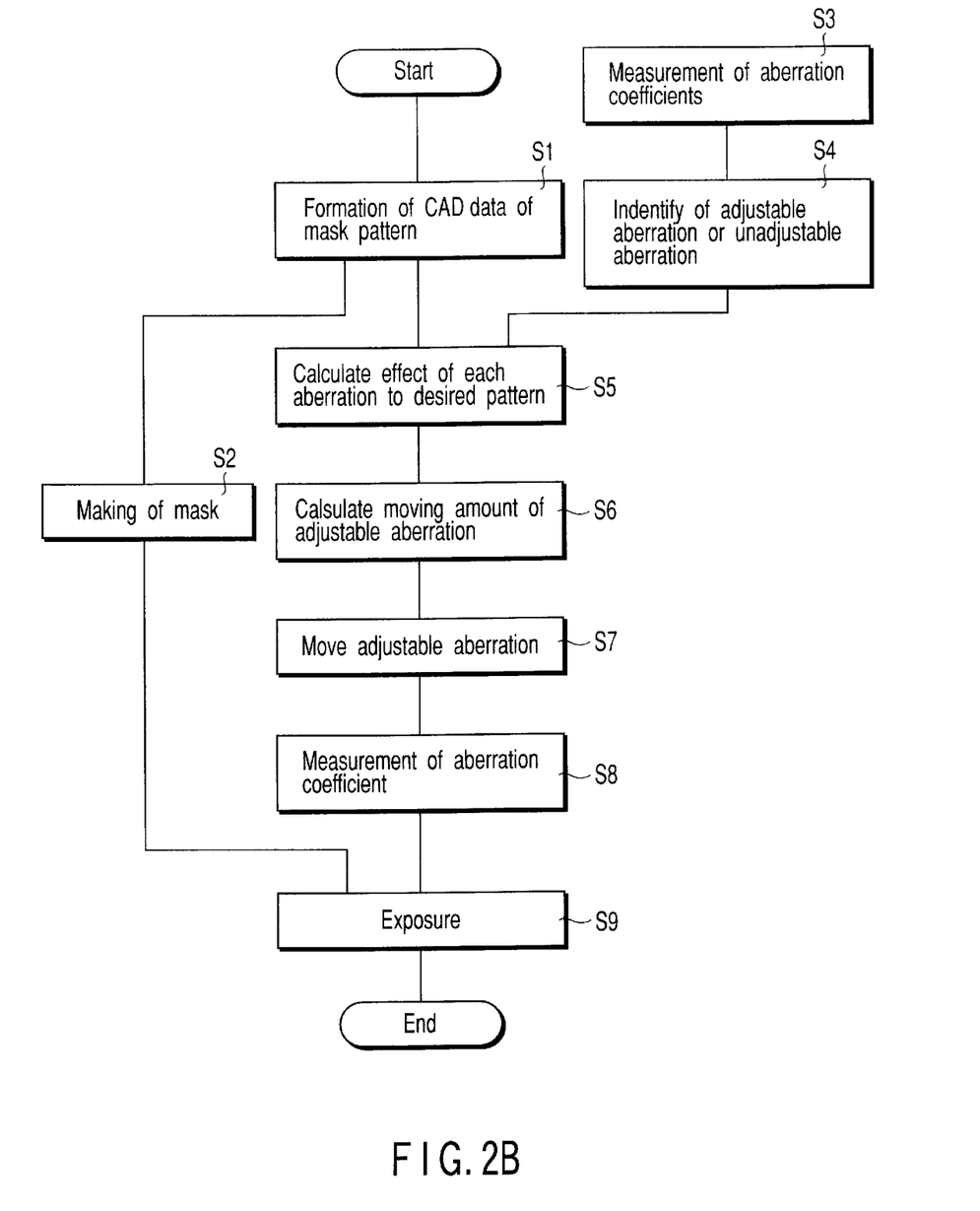
FIG. 2B is a flowchart illustrating the aberration correction method according to an embodiment of the present invention.

By contrast, in the flowchart of the embodiment shown in FIG. 2B, the aberration coefficients are measured in advance (S3), and at the point when the formation (S1) of the CAD data of a mask pattern is completed, the operational steps move onto the calculation of the effects of the aberrations for a desired pattern, and the manufacture (S2) of a mask, with use of the CAD data thus formed. When the manufacture of the mask is finished, an exposure (S9) is carried out. Especially, the mask manufacturing step is the most time consuming step, and therefore as compared to the conventional technique in which the manufacture of mask is repeated, the method of the embodiment of the present invention is significantly quick since the manufacture of mask is carried out only once in this embodiment. It should be noted here that the correction method illustrated in FIG. 2B should preferably be carried out for each photo mask.

Next, the steps illustrated in FIG. 2B will be described. First, the "measurement of aberration coefficients" (S3) will now be described. The measurement of the aberration coefficients was carried out by the same method as that discussed in Jpn. Pat. Appln. KOKAI Publication No. 11-237310, or "Appl. Opt. 37, pp. 1136 to 1147 (2000)" (Document 1). This method has such an advantage that the result of measurement can be directly converted into a Zernike coefficient. It is presently known that such a difference in width between right and left lines patterns as shown in FIG. 4 is not substantially effected by the aberrations expressed by functions of even type, such as spherical aberration and astigmatic aberration. Therefore, in this embodiment, only aberrations which can be expressed by functions of odd type, for example, comatic aberration and Three-foil, are focused.

Figure 5:
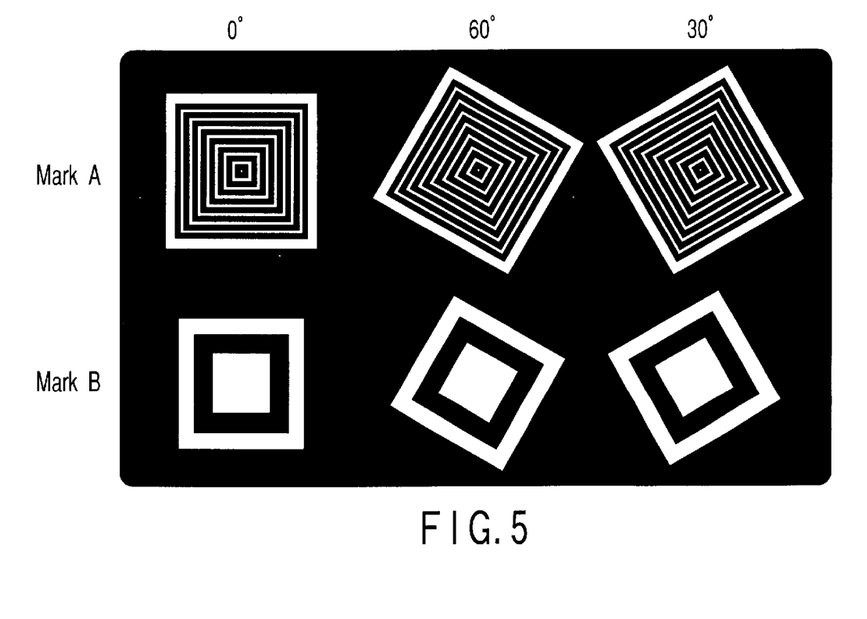
FIG. 5 is a diagram showing an example of the mask pattern used for measurement of aberration in the embodiment.
Figure 6:
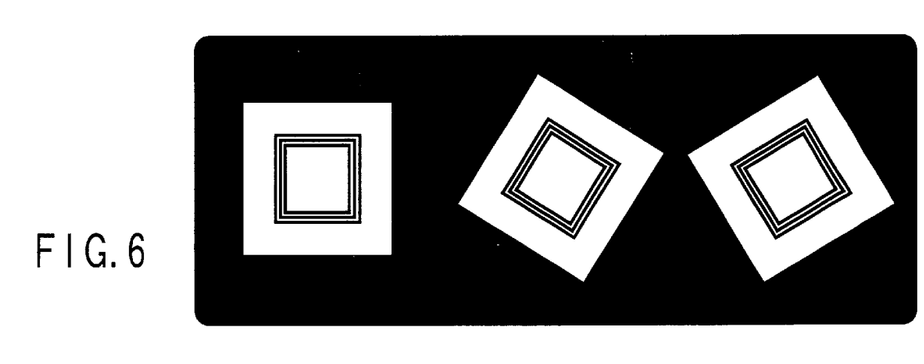
FIG. 6 is a diagram showing an example of the resist pattern used for measurement of aberration in the embodiment.

FIG. 5 shows a pattern of a mask used for measuring aberrations, used in this embodiment. This mask pattern consists of marks A and B. By carrying out exposure continuously such as to set the centers of both marks A and B one on the other, measurement marks such as shown in FIG. 6 are obtained on a substrate with a resist. As the measurement marks thus obtained are examined with an ordinary overlay examination device, transfer position errors between outer box patterns and inner fine patterns can be measured. Further, as the marks rotated by 0 degree, 30 degrees and 60 degrees are measured, not only the comatic aberration, but also Three-foil and Five-foil can be measured at the same time.

Figure 7:
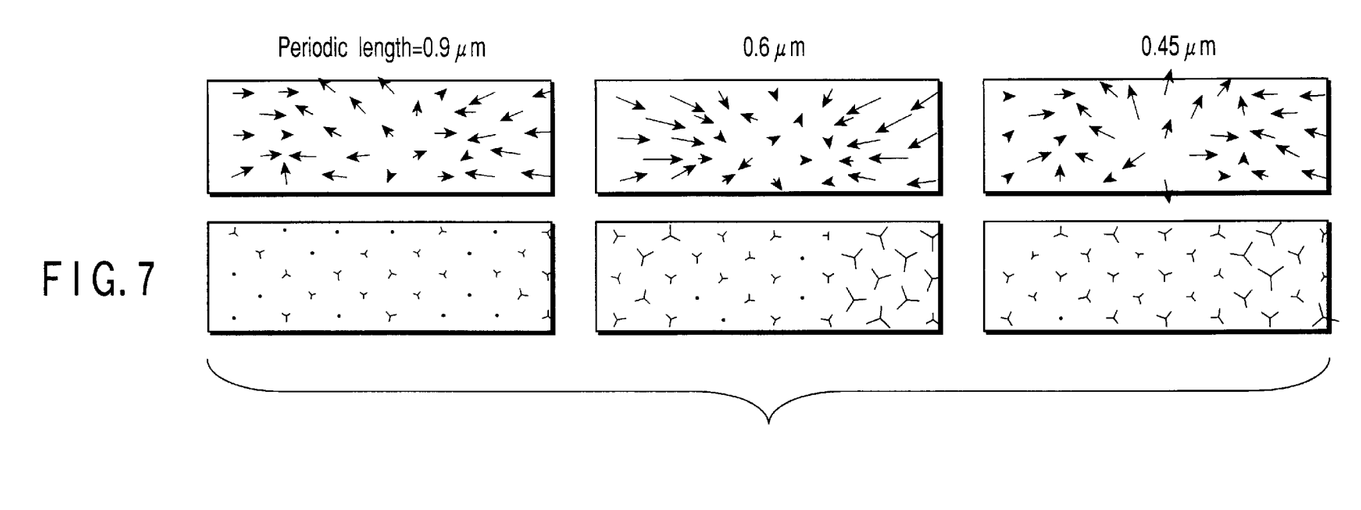
FIG. 7 is a diagram showing a result of measurement of aberration distribution in an initial state in the embodiment of the present invention.

FIG. 7 illustrates results of measurement when exposure was carried out with use of an exposure device of a scan type, having a KrF (krypton fluoride) excimer laser as a light source and a numeral aperture (NA) of 0.68. The exposure device carries out an exposure usually while scanning a rectangular slit; however since the object of this embodiment is to measure aberrations in the lens, the exposure was carried out while the slit being fixed. Rectangles shown in FIG. 7 each indicate a slit. In these slits, the length of one period of a fine pattern which constitutes an inner side portion of a measurement mark in each respective case is 0.9 µm, 0.6 µm and 0.45 µm. The length of the period is in inverse proportion to the radius of the lens, and therefore as the length of the period is shorter, the measurement of the aberrations are carried out in outer side of the lens. Further, the upper section of FIG. 7 indicates the distribution of the comatic aberration, whereas the lower section indicates the distribution of the Three-foil.

The Zernike coefficients at each measurement position within each slit are calculated on the basis of the results of measurements described above, using the method presented in the document 1 mentioned before. Since there are a numerous number of actually calculated numeral data, they will be omitted here.

Although the aberration measurement method described in Jpn. Pat. Appln. KOKAI Publication No. 11-237310 or the document 1 mentioned above, it is also possible to use an aberration measurement method which uses a Fizeau interferometer or an aberration measurement method discussed in U.S. Pat. No. 5,978,085. After moving the aberrations into a desired state by moving the lens unit constituting the projection optical system, it is preferable that the moved aberrations should be measured, in order to confirm the aberrations have been properly moved. In this case, it is only natural that the same measurement method should be used for both aberration measurements.

Next, the "identification of adjustable aberrations and unadjustable aberrations" (S4) will now be described. The exposure device used in this embodiment is a type which can vary only the comatic aberration. Therefore, the device has a function of intentionally chancing low-order comatic aberrations such as Z7 and Z8, Z14 and Z15, Z23 and Z24, etc., by moving each lens unit. It should be noted here that the lower the order of aberration, the higher the adjustable degree of the aberration, whereas the higher the order of aberration, the lower the adjustable degree. Further, the aberrations cannot be arbitrarily changed within the slit, but the changing operation is limited to the concentric distribution. On the other hand, the device does not have any adjusting function at all for Three-foil or Five-foil. Therefore, in this embodiment, the aberrations to be moved are limited to Z7 and Z8. In the aberration measurement discussed in the document 1, the measured data themselves are separated into comatic aberration, Three-foil and Five-foil. Therefore, adjustable aberrations and unadjustable aberrations can be easily identified in the measurement by comparing the measured data with the functions of the exposure device.

Next, the "calculation of the effects of each aberration to a desired pattern" (S5) will now be described. The effects of the aberration coefficients expressed by the Zernike polynomial on two-line patterns shown in FIG. 3 were examined. It is known that a difference in width between right and left lines of the pattern (the width of the left line—the width of the right line) can be expressed approximately by a linear combination of (aberration coefficient×degree of effect). Therefore, the difference in width between the right and left lines in the case where each aberration coefficient is assumed independently and evenly was calculated using the Fourier transformation. The results of the calculation are summarized in FIG. 8. Here, it is known that the difference in width between right and left lines of the pattern can be expressed approximately by a linear combination of (aberration coefficient×degree of effect), and therefore it suffices only if the calculation is carried out for the number of times corresponding to the number of Zernike coefficients considered. However, in the case of the dimensions (size) of patterns, it is sometimes necessary to take the cross term of two or more coefficient into consideration. In such a case, the cross term must be added to the horizontal axis of the graph, which indicates the degree of the effect of aberrations.

Figure 8:
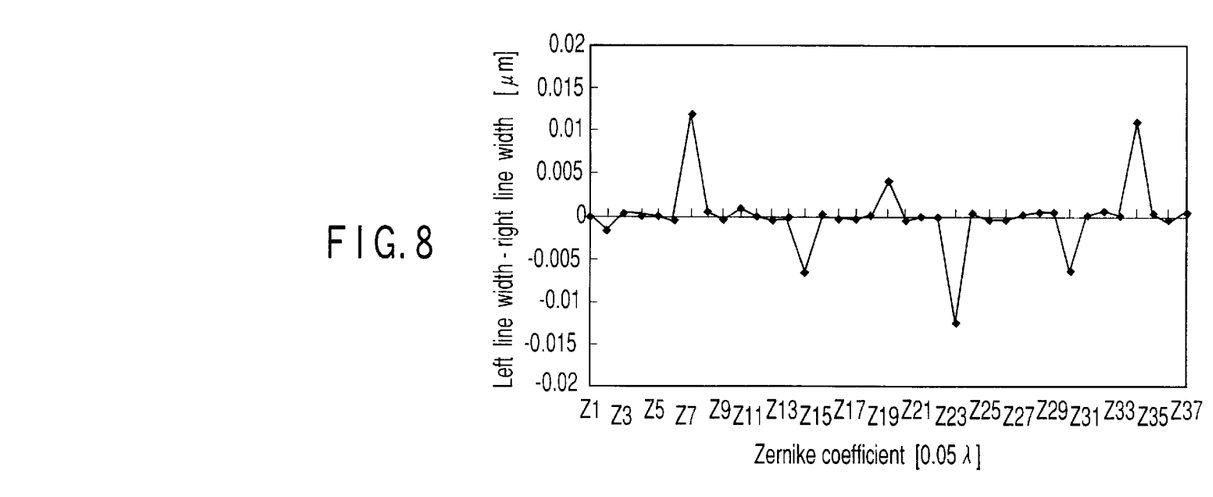
FIG. 8 is a diagram showing the degree of the effect of each of aberration coefficients to the mask pattern shown in FIG. 3.

Next, the "calculation of the moving amount of adjustable aberrations" (S6) will now be described. From the aberration coefficients actually measured and the graph of FIG. 8 showing the degree of the effects of the aberrations, the distribution of the difference in width of right and left line patterns within an entire region of a slit was calculated. At the same time, the amount of variation of aberrations which can minimize the line width difference in the entire slit was calculated by imaginary varying the aberrations to be adjusted in accordance with the function of the exposure device. The aberrations to be adjusted were Z7 and Z8; however the degree of effect caused by Z8 was negligibly small, and therefore only Z7 was adjusted in this case. It should be noted here that the entire region of the slit was assumed here; however in the case where a desired pattern is located in a limited region within the exposure region, the amount of variation may be calculated for the limited region. Further, it is also possible that a desired pattern is exposed while changing the amount of aberrations around the thus calculated aberration variation amount, the amount of variation is corrected on the basis of the exposure result.

Figure 9:
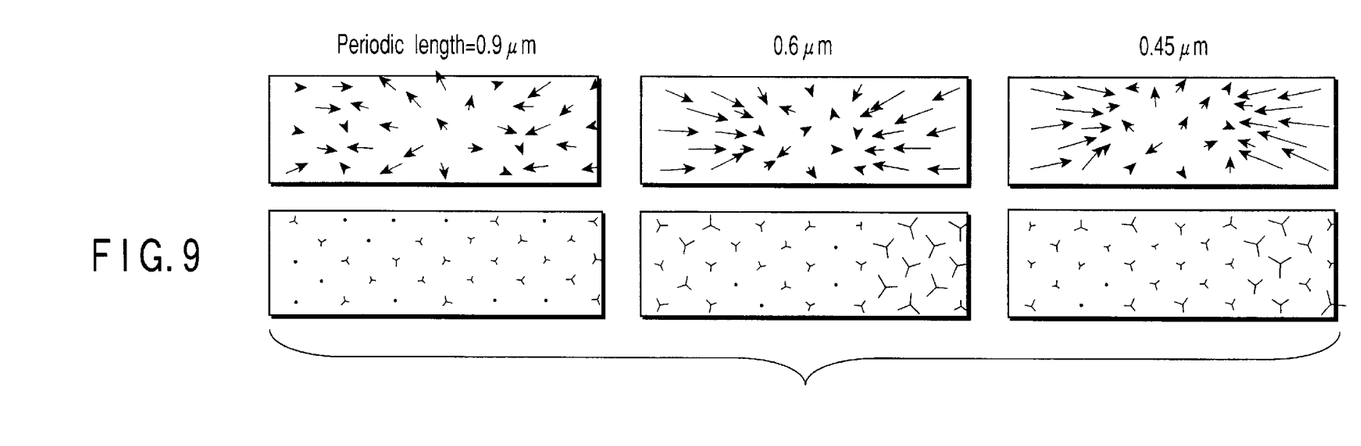
FIG. 9 is a diagram showing the result of measurement of aberration distribution after adjustment in the embodiment of the present invention.
Figure 10:
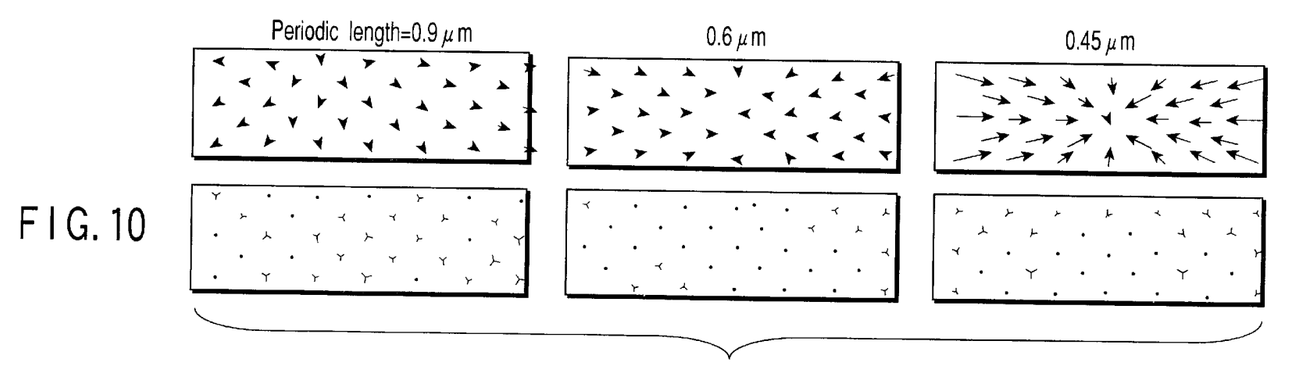
FIG. 10 is a diagram showing the aberration distribution which has been moved by the adjustment in the embodiment of the present invention.

Next, the "movement of adjustable aberrations" (S7) and the "measurement of aberration coefficients" (S8) will now be described. Here, the aberrations were moved on the basis of the movement amount calculated in the above-described step. In order to examine if the aberrations are moved as desired or not, the measurement of aberrations was once again carried out. The results of the measurements after adjusting the aberrations were shown in FIG. 9. Further, the difference between the initial state (FIG. 7) and the state after the adjustment (FIG. 9) is shown in FIG. 10. As can be understood from FIG. 10, only such a small difference that may be regarded as a measurement error was observed in the case of the Three-foil, and therefore it was confirmed that the aberrations were not substantially moved by the adjustment in the case of the Three-foil. Although it is not particularly indicated in an illustration, the same result was obtained in the case of the Five-foil. On the other hand, in the case of the comatic aberration, as the periodic length became shorter, the distribution became concentric and towards center, and therefore it was confirmed that a desired variation properly occurred. It was confirmed that aberrations of even functional type such as spherical aberration and astigmatic aberration, and global aberrations such as field curvature and distortion, exhibited such a small variation that would cause no substantial problem in the manufacture of semiconductor devices.

After a series of such aberration adjustments, a desired pattern is projected on a resist formed on a semiconductor substrate. As a result, an excellent pattern can be formed on an entire surface of an exposure region. Further, when such adjustments are carried out, it is possible to obtain excellent semiconductor device having a small line width distribution within an exposure region. It should be noted here that in this embodiment, the adjustable comatic aberration is varied with respect to the unadjustable Three-foil so as to cancel out the effect of the Three-foil; however it is only natural that the present invention can be applied to some other relationship than that between a Three-foil and comatic aberration.

Since various types of photomasks are used for one exposure device, there are exposure recipes each corresponding to the respective photomask. Each recipe includes information registered including, for example, a photomask to be used, exposure conditions such as an exposure amount and a focusing offset, a designation of an exposure region, a designation of an exposure position within a wafer, and alignment data. In order to perform the method of the present invention at quick rate, it is preferable that the data corresponding to the amount of the variation of aberrations should be added in the recipe. It is further desirable that the "movement of adjustable aberrations" should be carried out automatically in response to the selected exposure recipe and the aberration data in the exposure recipe.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of correcting a residual aberration of a projection optical system, which is used for projecting a pattern of a photo mask onto a photosensitive film located on a substrate, said method comprising:

calculating an effect of a residual aberration on a given pattern on the basis of the residual aberration of the projection optical system obtained by measurement;

calculating a moving amount of an adjustable aberration in the projection optical system to minimize the effect of the residual aberration on the given pattern in a given area; and moving the adjustable aberration in accordance with the calculated moving amount.

2. A method according to claim 1, further comprising measuring the adjustable aberration moved.

3. A method according to claim 1, wherein the effect of the residual aberration is calculated with use of coefficients of a Zernike polynomial.

4. A method according to claim 1, wherein the moving amount is calculated by imaginarily varying the adjustable aberration.

5. A method of manufacturing a semiconductor device, comprising:

correcting a residual aberration of a projection optical system, using the method according to claim 1; and projecting a pattern of a photo mask onto a photosensitive film located on a semiconductor substrate by the projection optical system.

* * * * *